United States Patent [19]

Ohnari

[11] Patent Number: 4,779,050
[45] Date of Patent: Oct. 18, 1988

[54] CIRCUIT ARRANGEMENT FOR JUDGING THE LIFETIME OF A BATTERY IN A NO-BREAK POWER SUPPLY SYSTEM

[75] Inventor: Eiji Ohnari, Fukuokacity, Japan

[73] Assignee: Eikoh Giken Co., Ltd., Fukuoka Prefecture, Japan

[21] Appl. No.: 901,186

[22] Filed: Aug. 28, 1986

[30] Foreign Application Priority Data

Jan. 14, 1986 [JP] Japan ................... 61-3464
Jan. 14, 1986 [JP] Japan ................... 61-3465
Mar. 7, 1986 [JP] Japan ................... 61-33024

[51] Int. Cl.⁴ .............................. G01N 27/46
[52] U.S. Cl. ........................ 324/426; 320/48
[58] Field of Search .................. 324/425–428, 324/433; 340/636; 320/48; 307/66

[56] References Cited

U.S. PATENT DOCUMENTS 4,323,788 4/1982 Smith ........................... 307/66
4,361,809 11/1982 Bil et al. ....................... 324/426
4,517,517 5/1985 Kinney ....................... 320/48 X Primary Examiner—Reinhard J. Eisenzopf
Assistant Examiner—Jack B. Harvey
Attorney, Agent, or Firm—Toren, McGeady & Associates

[57] ABSTRACT

A circuit arrangement for judging the lifetime of a battery used in a no-break power supply system includes a step-down transformer connected to an AC power source, a first switch connected between the transformer and a rectifier, a voltage detector connected to one electrode of a battery, an auto-timer connected to the voltage detector, and a second switch connected to the auto-timer and interlocked to the first switch.

10 Claims, 5 Drawing Sheets

CIRCUIT ARRANGEMENT FOR JUDGING THE LIFETIME OF A BATTERY IN A NO-BREAK POWER SUPPLY SYSTEM

BACKGROUND OF THE INVENTION

The present invention relates to a circuit arrangement for judging the lifetime of a battery in a no-break power supply system.

In a conventional no-break power supply system, as shown in FIG. 1, the AC power of an AC power supply source P (commercial power source) is converted into a DC power through a rectifier Rec and a smoothing capacitor C and the DC power thus obtained is again inverted by an inverter IV, including an automatic voltage regulating means, into an AC power having a constant voltage and constant frequency, which is supplied to a load L such as a computer or the like so that the load L is operated with such an AC power under a normal condition of the AC power source.

While, under such a condition, the AC power source P charges, through a charging unit CH under a floating charge condition, a battery B having one electrode connected to the ground and the other electrode connected to the input of the inverter IV through a diode D, so that the battery B compensates for the supplying power to the inverter IV when a service interruption occurs or the output voltage of the rectifier Rec becomes lowered by some failure. This floating charge system is suitable for the no-break power supply system comprising the battery with comparatively small capacity.

In another conventional no-break power supply system, as shown in FIG. 2, the AC power of an AC power supply source P (such as a commercial power source) is converted into a DC power through a rectifier Rec such as a thyristor and a smoothing capacitor C and the DC power thus obtained is again inverted by a inverter IV including an automatic voltage regulating means, into an AC power having a constant voltage and constant frequency, which is supplied to a load L such as a computer of the like. In this case, the rectifier Rec has to charge, under a floating charge condition, a battery B connected between the input of the inverter IV and a ground in order to compensate for the DC power in the case of service interuption, so that the conducting phase of the rectifier Rec is controlled by a thyristor control circuit CN1 so as to adjust the DC power finely. This floating charge system is suitable for the no-break power supply system comprising a battery with comparatively large capacity.

In comparatively large scale no-break power supply system using a stationary battery, even in the circuit arrangments shown in FIGS. 1 and 2, an ordinary maintenance may judge the lifetime of respective batteries with easy by regularly checking the voltage, the specific gravity or the like of the respective batteries. In recent small no-break power supply systems with easy maintenance and small capacity, small enclosed lead storage batteries are actively used. When such an enclosed type battery is used, it is difficult to judge the performance or lifetime of the battery because of the enclosed structure. Particularly, as the lifetime of the battery approaches the end thereof, it is necessary to try a discharging test to decide the term of exchanging the battery. Even if the battery is not approaching the end of its lifetime, when one of cells or batteries fails since the number of series connected cells is usually several tens, the discharging property deteriorates and, in the extreme case, the no-break power supply system does not actuate, so that the voltage across the load decreases rapidly with service interruption of the commercial power supply source resulting in an infection onthe load being the computer. In order to avoid such a condition, the battery must be actually discharged to check such a condition.

In the conventional system shown in FIGS. 1 and 2 generally, the service interrupting condition is forcedly generated during operation of the no-break power supply system to discharge the battery thereby performing such a check. If at such a checking, failure of the battery has been generated, the output voltage of the no-break power supply system is abnormally decreased, thereby causing an infection on the load such as a computer down. Actually, the discharging test of the battery is difficult under the forced service interrupting condition during operation of the no-break power supply system.

SUMMARY OF THE INVENTION

It is an object of the present invention to overcome the above mentioned disadvantages of the conventional circuit arrangement for judging the lifetime of a battery in a no-break power supply system.

It is another object of the present invention to provide a circuit arrangement for judging the lifetime of a battery in a no-break power supply system.

According to a first aspect of the present invention a circuit arrangement for judging the lifetime of a battery in a no-break power supply system comprises a rectifier means connected to an AC power source, an inverter connected to the rectifier means and having an automatic voltage regulating function, a load connected to the inverter, a diode having a cathode connected to the input of the inverter, a battery having one electrode connected to an anode of the diode and another electrode connected to ground, a charging unit connected between the battery and the AC power source, a step-down transformer connected to the AC power source, a first switching means connected between the transformer and the rectifier means, a voltage detector connected to one electrode of the battery, an auto-timer connected to the voltage detector, and a second switching means connected to the auto-timer and interlocked to the first switching means.

The input voltage of the inverter caused by the actuation of the first switching means is higher than the discharge final voltage of the battery, and the input voltage of the voltage detector which generates an output signal is higher than the input voltage of the inverter. The load is a computer.

According to a second aspect of the present invention, a circuit arrangement for judging the lifetime of a battery in a no-break power supply system comprises a rectifier means connected to an AC power source, an inverter connected to the rectifier means and having an automatic voltage regulating function, a load connected to the inverter, a battery having one electrode connected to the input of the inverter and another electrode connected to ground, a thyristor control unit connected to control the rectifier means and having an exchange mechanism therein, a voltage detector connected between the battery and the thyristor control unit, an auto-timer connected between the voltage detector and the thyristor control unit, and an interlocked switching means connected to the auto-timer.

The thyristor control means receives output signals of the voltage detector and the auto-timer to actuate the interlocked switching means by the exchange mechanism, the input voltage of the inverter caused by the actuation of the first switching means is higher than the discharge final voltage of the battery, and the input voltage of the voltage detector which generates an output signal is higher than the input voltage of the inverter.

According to a third aspect of the present invention, a circuit arrangment for judging the lifetime of a battery in a no-break power supply system comprises a first rectifier connected to an AC power source, an inverter connected to the first rectifier, a load connected to the inverter, a second rectifier having an input connected to an engine-generator and an output connected to an input of the inverter, a diode having a cathode connected to the inverter, a battery having one electrode connected to an anode of the diode and another electrode connected to ground, a voltage detector connected to the one electrode of the battery, a time counting means connected to the voltage detector, a change-over switching means connected across the diode for short-circuiting the diode, a dummy load connected to the battery by the change-over switching means, and a switch connected to the time counting means and interlocked with the change-over switching means.

The change-over switching means short-circuits the diode as well as supplies an operation stop signal to the voltage detector in one switching state, and supplies the power of the battery to the dummy load as well as closes the switch which supplies a count starting signal to the time counting means, in the other switching state.

DETAILED EXPLANATION OF THE PREFERRED EMBODIMENTS

Figure 3:
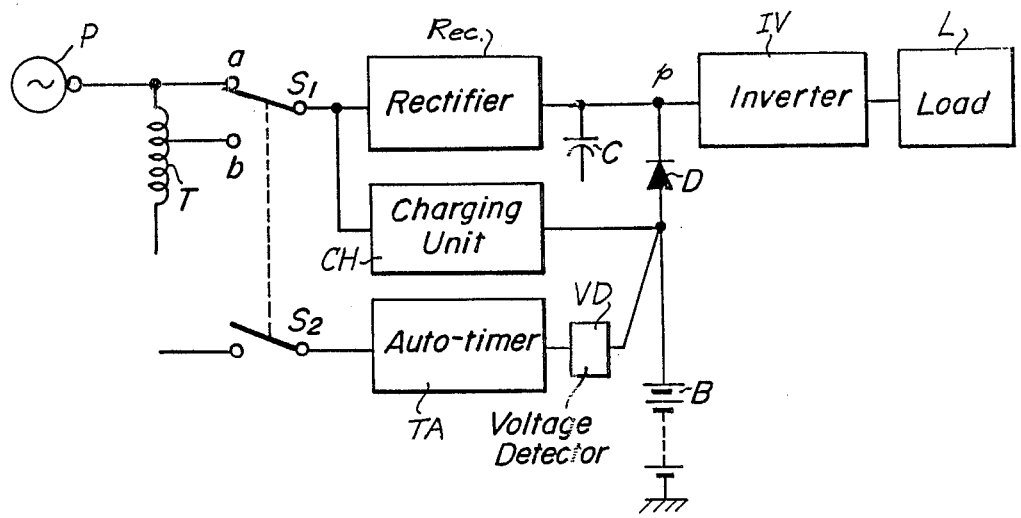
FIG. 3 is a block diagram showing a first embodiment of a circuit arrangment for judging the lifetime of a battery used in a no-break power supply system according to the present invention.
Figure 4:
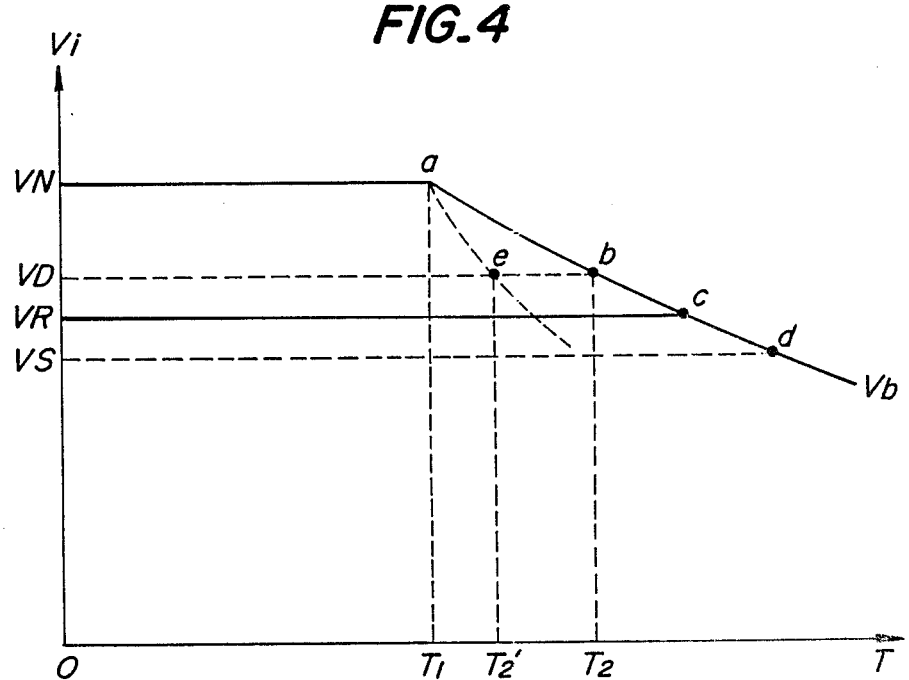
FIG. 4 is an explanatory view showing a discharge charactristic of a battery for explaining the operation of the circuit arrangement according to the present invention.

According to FIGS. 3 and 4 of the drawings, there is shown one embodiment of a circuit arrangement for judging the lifetime of a battery used in a no-break power supply system according to the present invention.

Figure 1:
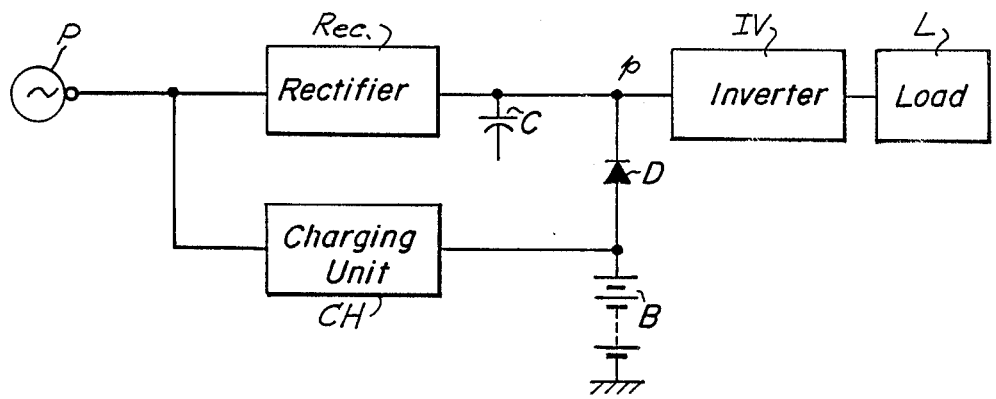
FIG. 1 is a block diagram showing a conventional no-break power supply system.
Figure 2:
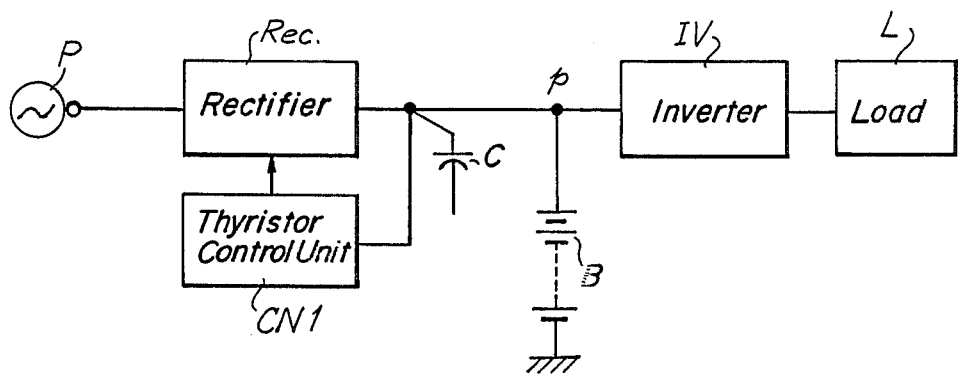
FIG. 2 is a block diagram showing another conventional no-break power supply system.

FIG. 3 shows an electrical connection of the circuit arrangement according to the present invention. FIG. 4 show the discharging characteristic of the battery for explaining the operation of the circuit arrangement according to the present invention. The same reference numerals and letters are used for components corresponding to those in FIGS. 1 and 2. In FIG. 4, the time T is plotted on abscissa and the voltage of the battery B (input voltage of the inverter, hereinafter referred to as point P voltage) is plotted on ordinate. Reference T is a step-down transformer connected to a commercial power source P and set in such a manner that when a switch $S_1$, is changed to a contact b the DC output voltage is changed from a normal value VN to a reduced value, thereby reducing the AC input voltage to the no-break power supply system temporarily in order to perform the discharge test for the battery B.

Reference VD is a voltage detector connected to one electrode of the battery B. The voltage detector VD always detects Vb of the battery B and is set to generate an output signal when the voltage Vb reaches the voltage point b.

An auto-timer TA is connected to receive the output signal of the voltage detector VD for automatically counting and measuring the time duration fromt he discharge starting instant to the instant at which the voltage Vb of the battery reaches the voltage point b. An analog counter and an automatic digital voltage meter may be utilized as the auto-timer.

Reference $S_2$ is a switch interlocked to the switch $S_1$ for commencing the operation of the timer TA.

The operation and the advantageous effect of this embodiment is described as follows. In the discharge characteristic of the voltage Vb of the battery B shown in FIG. 4, a point a shows the input voltage of the inverter IV at the discharge starting (normal voltage VN), $T_1$ shows an instant when the input voltage is applied to a point p shown in FIG. 3, and a point d shows the discharge final voltage VS of the battery B which also shows the lowest voltage for automatically stopping the system itself when the voltage of the battery becomes lower than the discharge final voltage VS.

A point c shows a change-over voltage when the switch $S_1$ is changed to the contact b of the step-down transformer T, a point b shows the voltage when the voltage detector VD generates an output signal, and thus $T_2$ shows an instant when the output signal of the voltage detector VD is generated. The voltages of respective points are different according to the characteristic of the battery B to be used. When the upper limit voltage per one cell or battery is 2.2 volts and the lower limit voltage (discharge final voltage) is 1.8 Volts, respective points are set as follows: The point a is 2.2 V, the point b is 1.85 V, the point c is 1.83 V and the point d is 1.8 V.

When the AC power source is normal, the system maintains the condition shown in FIG. 3, so that the DC power is supplied to the inverter IV through the rectifier Rec, thereby operating the load L normally.

Under such a condition, in order to test the battery B by discharging, the switch $S_1$ is changed to the contact b of the step-down transformer T to decrease the voltage of the AC power source, so that the output of the rectifier Rec becomes decreased and thus the voltage at the point p is changed to the change-over voltage VR, that is, the voltage at the point c by the transformer T.

This voltage VR is lower than the battery voltage so that the battery begins to discharge through the diode D (normal voltage VN, that is, the voltage at the point a).

The switch $S_2$ is closed at the same time the switch $S_1$ is changed to the contact b of the transformer T, so that the auto-timer TA is actuated to record the starting instant $T_1$ and count the discharging duration.

Under such a discharging condition, when the battery voltage Vb is gradually decreased along the downward curve to reach the point b, the voltage detector VD connected to the battery B generates an output signal which is supplied to the auto-timer TA, thereby recording the instant $T_2$, so that the auto-timer TA may detect the duration $T_2-T_1$.

By preforming such a discharging test periodically, the lifetime of the battery B may be judged precisely, since the power consumption of the load L is substantially constant.

According to the present invention, even if a part (one cell) of the battery B fails or a contact failure of the battery terminals is generated, thereby decreasing the voltage at the point p rapidly as shown by the broken line e, a substantially constant voltage is supplied to the load L continuously by the automatic voltage regulating function of the inverter IV since the change-over voltage VR (the voltage at the point c) of the transformer T is set higher than the discharge final voltage VS (the voltage at the point d), so that the load L, or the computer, is not subjected to any harm. Moreover, the auto-timer TA records the instant $T_2$ thereby detecting the shortening of the time duration so that the presence of the failure battery may be easily judged.

Figure 5:
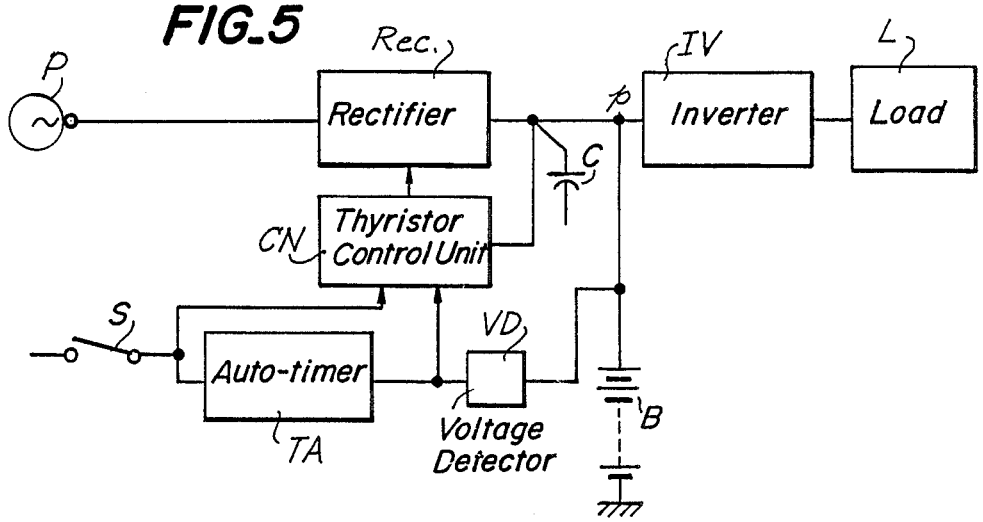
FIG. 5 is a block diagram showing second embodiment of a circuit arrangement for judging the lifetime of a battery used in a no-break power supply system according to the present invention.

FIG. 5 shows a second embodiment of the circuit arrangement according to the present invention.

In this embodiment, the rectifier Rec is formed by a thyristor, and a thyristor control circuit or unit CN is connected to the rectifier Rec. The control unit CN comprises a change-over mechanism (not shown) constructed to obtain a predetermined voltage (change-over voltage) by short-circuiting the incorportated voltage dividing resistor. The control unit CN controls the conducting phase of the rectifier Rec by supplying gate pulses to its gate. When the change-over mechanism is operated, the DC output voltage of the rectifier is set in such a manner that the normal value VN is changed to the change-over value VR. This change-over mechanism is used to perform the discharging test of the battery B as shown in the first embodiment.

An interlocked switch S is connected to an auto-timer TA to commence the operation thereof automatically when the change-over mechanism is operated. The other construction of this embodiment is the same as that of the first embodiment so that the detailed explanation thereof is omitted.

The operation of the circuit arrangement is described as follows.

A substantial part of the operation of this embodiment is the same as that of the first embodiment so that only the operation different from that of the first embodiment is described.

In the present embodiment of point c, shown in FIG. 4, designates the change-over voltage when the change-over mechanism is operated.

When the AC power source is normal, the system maintains the condition shown in FIG. 5, so that the DC power is supplied to the inverter IV through the rectifier Rec, thereby operating the load L normally.

Under such a condition, in order to test the battery B by discharging, the change-over mechanism (not shown) of the thyristor control circuit CN is operated to decrease the output of the rectifier Rec to the change-over voltage VR, that is, the voltage at the point c shown in FIG. 4, so that this voltage VR is lower than the battery voltage, thereby commencing the discharging of the battery (normal voltage VN, that is, the voltage at the point a).

The above change-over operation closes the switch S which is interlocked therewith so that the auto-timer TA is operated to record the starting instant $T_1$ and count the discharging duration.

Under such a discharging condition, the battery voltage Vb is gradually decreased along the downward curve to reach the point b, at which point the voltage detector VD connected to the battery B generates an output signal which is supplied to the auto-timer TA, thereby recording the instant $T_2$, so that the auto-timer TA may detect the duration $T_2-T_1$.

By preforming such a discharging test periodically, the lifetime of the battery B may be judged precisely, since the power consumption of the load L is substantially constant.

According to the present invention, even if a part (one cell) of the battery B fails or a contact failure of the battery terminals is generated thereby decreasing the voltage at the point p rapidly as shown by the broken line e, a substantially constant voltage is supplied to the load L continuously be the automatic voltage regulating function of the inverter IV since the change-over voltage VR (the voltage at the point c) of the transformer T is set higher than the discharge final voltage VS (the voltage at the point d), so that the load L, or the computer, is not subjected to any harm. Moreover, the auto-timer TA records the instant $T_2'$ thereby detecting the shortening of the time duration so that the presence of the failure battery may be easily judged.

Figure 6:
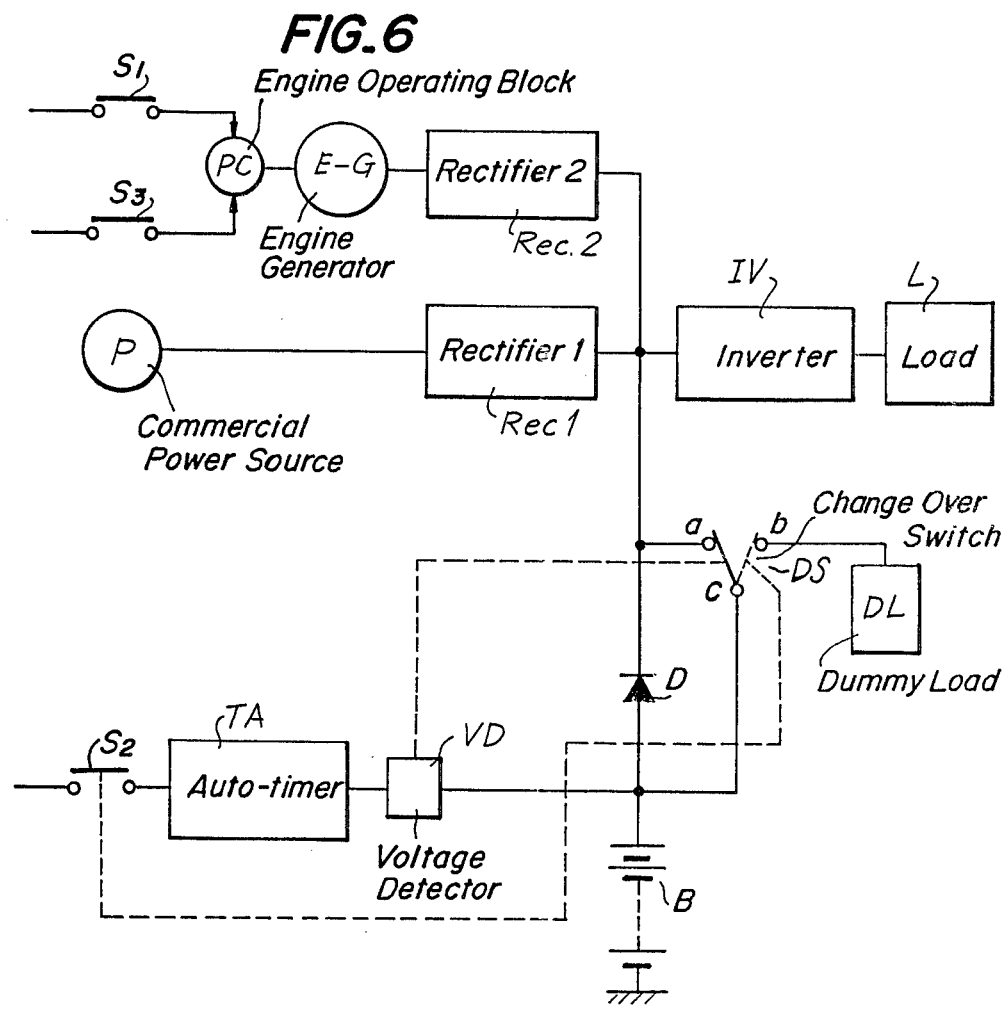
FIG. 6 is a block diagram showing third embodiment of a circuit arrangement for judging the lifetime of a battery used in a no-break power supply system according to the present invention.

FIG. 6 shows a third embodiment of the circuit arrangement for judging the lifetime of a battery used in a no-break power supply system.

In FIG. 6, referenc $S_1$ is a normal-off switch for generating an engine start signal to an engine-generator E-G. Reference $S_3$ is a normal-on swtich for generating an engine stop signal to the engine-generator E-G. Switches $S_1$ and $S_3$ are connected to engine operating unit or block PC which is connected to the engine-generator E-G. The engine-generator E-G is connected, through a rectifier Rec 2, to an inverter IV for supplying an AC power to a load L and having an automatic voltage regulating function. the load L may be a computer. The input of the inverter IV is also connected to a rectifier Rec 1 through a commercial power source p, on the one hand, and to a battery B through a diode D, on the other hand. The battery B has one electrode connected to the anode of the diode D and the other electrode connected to he ground. A change-over switch DS is connected across the diode D and connected to a dummy load DL. The switch DS comprises three contacts a, b and c. The common contact c is connected to a junction point of the anode of the diode D and the positive electrode of the battery B. When the common contact c is connected to the contact a, the diode D is short-circuited so that the outputs of the rectifiers Rec 1 and Rec 2 are charged on the battery B in a floating manner.

A voltage detector VD is connected to the positive electrode of the battery B to monitor the battery voltage. When the battery voltage becomes a preset voltage at the point c shown in FIG. 7, the voltage detector VD generates and supplies a stop signal to a time counting block or auto-timer TA.

The auto-timer TA is operated by the signal from the voltage detector VD to count the time duration between the discharge starting instant $T_1$ of the battery B and the instant at which the battery voltage reaches the predetermined value. When the switch DS is changed to the contact b to connect the battery B to the dummy load DL, the switch $S_2$ is closed to supply the count starting signal to the time counting block TA.

The operation of the circuit arrangement shown in this embodiment is described as follows. The circuit arrangement is supplied by the commercial power source P so that the DC output of the rectifier Rec 1 is supplied to the inverter IV which supplies the AC power with constant voltage and constant frequency to the load, such as a computer. At the same time, the output voltage of the rectifier Rec 1 is charged on the battery B through the contacts a and c of the switch DS in the floating manner.

Under such a condition, in order to commence the discharging test of the battery, it is necessary to prevent the load L from being subjected to an infection even in the case of service interruption of the commercial power supply source P. To this end, the switch $S_1$ is closed to generate the engine starting signal which is supplied to the engine-generator E-G. The AC output of the engine-generator E-G is converted into the DC output power through the rectifier Rec 2. That is the DC power obtained through the rectifier Rec 2 is supplied to the inverter IV in parallel with the DC power obtained through the rectifier Rec 1 from the commercial power source P, so that the inverter IV is continuously operated, without any effect, by the DC power obtained through the rectifier Rec 2 even in the case of service interruption of the commercial power source.

Under such a condition, when the switch DS is changed to the contact b to connect the battery B to the dummy load DL, the interlocked switch $S_2$ generates and supplies the count starting signal to the time counting block or the auto-timer TA.

Figure 7:
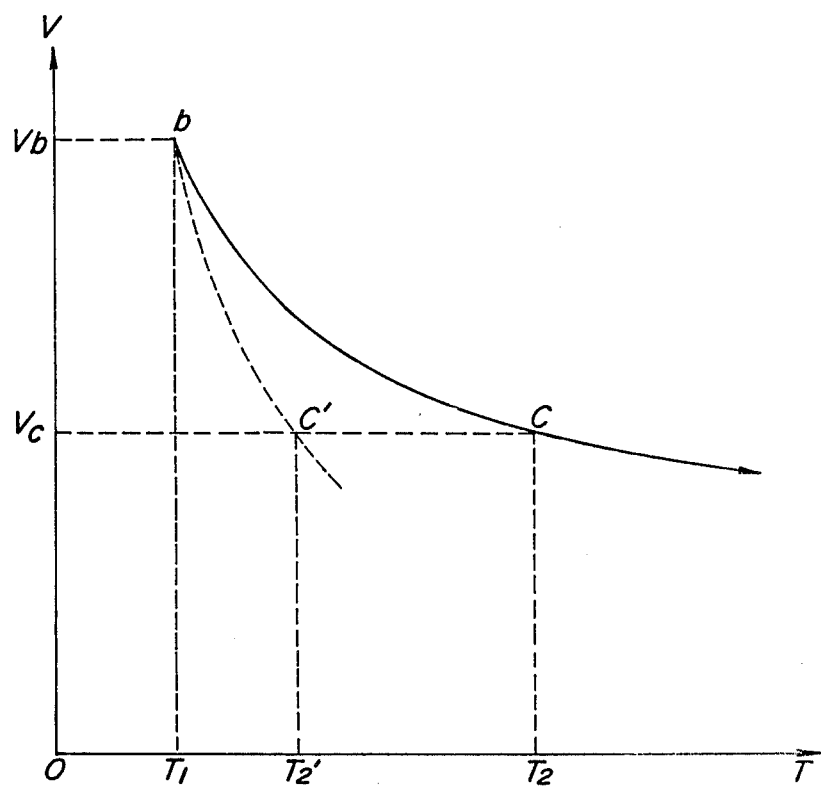
FIG. 7 is an explanatory view showing a discharge characteristic of a battery for explaining the operation of the circuit arrangement according to the present invention.

The discharge characteristic of the voltage V of the battery B is shown in FIG. 7. The voltage V of the battery B is plotted on the ordinate and the time T is plotted on the abscissa. A point b on the discharge characteristic curve shows the voltage Vb when the switch DS is changed to the contact b. At this instant $T_1$, the switch $S_2$ is closed by the interlock action at the time the current flows through the dummy load DL from the battery, thereby supplying the count starting signal to the auto-timer TA which records this instant $T_2$. A point c on the discharge characteristic curve shows the voltage Vc when the voltage detector VD generates and supplies its output signal to the time counting block TA thereby stopping the counting action. The auto-timer TA also records the instant $T_2$ at which the voltage Vc is generated.

The time counting block TA may record the discharge start instant $T_1$ of the battery B and the instant $T_2$ at which the discharge voltage reaches at the predetermined point c along the downward curve of the discharge, so that the time duration $T_2-T_1$ may be known easily. The shape of the downward curve is previously known as the discharge characteristic to the predetermined load of the battery to be used.

If the switch DS is changed to the contact b and its discharge characteristic curve follows on the downward curve from the point b to the point c, it is decided that the battery B operates normally. This decision may easily be obtained from the time duration $T_2-T_1$ by the characteristic or discharge test. The voltage detector VD generates and supplies the action stopping signal to the auto-timer TA by changing the switch DS to the contact a to open the switch $S_2$ so that the auto-timer TA stop its counting action. The switch $S_2$ is then closed to stop the operation of the engine-generator E-G.

If the voltage of the battery B is rapidly by decreased to the voltage Vc or the present point C', as shown FIG. 7 by a broken line, during the discharge characteristic test, the voltage detector VD generates and supplies the action stopping signal to the time counting block TA as in the same manner as the above, thereby detecting the instant $T_2'$ so that it is decided that the battery B becomes abnormal.

If the dummy load DL is heated during the discharge test of the battery B, it may be forcedly cooled by a radiator fan of the engine-generator E-G.

What is claimed is:

1. A circuit arrangement for judging the lifetime of a battery in a no-break power supply system, comprising rectifier means having an input coupled to an AC power source; an inverter, having an automatic voltage regulating function, connected to an output of said rectifier means; a load connected to an output of said inverter; a diode having a cathode connected to an input of said inverter; a battery having one electrode connected to an anode of said diode and another electrode connected to ground; and a charging unit connected between the input of said rectifier means and a junction point of said battery and said diode; characterized in that said circuit arrangement further comprises:

a step-down transformer connected to said AC power source, said step-down transformer having at least two taps on a secondary side thereof;

first switching means for electively connecting one of said two taps to the input of said rectifier means thereby coupling said rectifier means to said AC power source, whereby one of said taps is connected to the input of said rectifier means in a normal operating mode, while another of said taps, supplying a lower voltage than said one of said taps, is connected to the input of said rectifier means in a battery judging mode;

a voltage detector, having a predetermined threshold level, connected to the junction point of said diode and said battery;

an auto-timer for indicating a time duration having a stop input connected to an output of said voltage detector;

second switching means connected to a start input of said auto-timer; and means for interlocking said second switching means to said first switching means, whereby when judging said battery, said first switching means is switched to connect said another tap to said rectifier means while said second switching means starts said auto-timer, said auto-timer being stopped by said voltage detector when a voltage at said junction point drops below said threshold level, the time duration indicated by said auto-timer being a measure of the lifetime of the battery.

2. A circuit arrangement as claimed in claim 1, wherein, in said battery judging mode, an input voltage of the inverter is higher than a discharge final voltage of the battery, and the threshold level of the voltage detector is higher than the input voltage of the inverter.

3. A circuit arrangement as claimed in claim 1, wherein the rectifier means comprises a rectifier and a smoothing capacitor connected thereto.

4. A circuit arrangement as claimed in claim 1, wherein the load is a computer.

5. A circuit arrangement for judging the lifetime of a battery in a no-break power supply system, comprising rectifier means connected to an AC power source; an inverter having an input connected to an output of said rectifier means and having an automatic voltage regulating function; a load connected to an output of said inverter; a battery having one electrode connected to the input of the inverter and another electrode connected to ground; and a thyristor control unit connected to the output of and a control input of said rectifier means, said thyristor control unit having a change-over mechanism therein for changing over a controlled voltage level; characterized in that said circuit arrangement further comprises:

- a voltage detector having a predetermined threshold level and having an input connected to a junction point of said battery and said inverter and an output connected to a reset input of said thyristor control unit for the change over mechanism therein;
- an auto-timer, for indicating a time duration, having a stop input also connected to the output of said voltage detector; and
- switching means connected to both a start input of said auto-timer and a set input of said thyristor control unit for the changeover mechanism therein, whereby, when judging the lifetime of the battery, said switching means sets the change-over mechanism to a lower controlled voltage level and starts said auto-timer, said change-over mechanism being reset and said auto-timer being stopped by said voltage detector when a voltage at said junction point drops below said threshold level, the time duration indicated by said auto-timer being a measure of the lifetime of the battery.

6. A circuit arrangement as claimed in claim 5, wherein, in a battery judging mode, an input voltage of the inverter is higher than a discharge final voltage of the battery, and the threshold level of the voltage detector is higher than the input voltage of the inverter.

7. A circuit arrangement as claimed in claim 5, wherein the rectifier means comprises a rectifier and a smoothing capacitor connected thereto.

8. A circuit arrangement as claimed in claim 7, wherein the rectifier is a thyristor.

9. A circuit arrangement as claimed in claim 5, wherein the load is a computer.

10. A circuit arrangement for judging the lifetime of a battery in a no-break power supply system, comprising a first rectifier having an input connected to an AC power source; an inverter having an input connected to an output of said first rectifier; a load connected to an output of said inverter; a second rectifier having an input connected to an engine-generator and an output also connected to the input of said inverter; a diode having a cathode connected to the input of the inverter; and a battery having one electrode connected to an anode of said diode and another electrode connected to ground; characterized in that said circuit arrangement further comprises:

- a voltage detector having a predetermined threshold level and an input connected to a junction point of said diode and said battery;
- timer means, for measuring a time duration, having a stop input connected to an output of said voltage detector;
- a dummy load;
- change-over means for selectively short-circuiting said diode or connecting said dummy load to the junction point of said diode and said battery;
- switching means connected to a start input of said timer means; and
- means for interlocking said switching means to said change-over means, whereby, when judging the lifetime of said battery, said change-over means connects said dummy load to said junction point and said switching means starts said timer means, said voltage detector stopping said timer means when a voltage at said junction point drops below said threshold level, the time duration indicated by said timer means being a measure of the lifetime of the battery.

* * * * *